MULTILAYER THIN FILM PIEZOELECTRIC TRANSDUCERS

Filed March 28, 1968

WITNESSES

Edwin E. Bassler

James F. Young

INVENTORS
John deKlerk &
Eugene F. Kelly
BY Gordon H. Telfer
ATTORNEY.

United States Patent Office 3,497,727

Patented Feb. 24, 1970

3,497,727
MULTILAYER THIN FILM PIEZOELECTRIC TRANSDUCERS

John de Klerk and Eugene F. Kelly, Pittsburgh, Pa., assignors to Westinghouse Electric Corporation, Pittsburgh, Pa., a corporation of Pennsylvania Filed Mar. 28, 1968, Ser. No. 716,889
Int. Cl. H02n *1/00*
U.S. Cl. 310—8.6 9 Claims

ABSTRACT OF THE DISCLOSURE

A transducer for electrical-acoustic energy conversion is provided having a plurality of layers of piezoelectric material, each layer having an effective thickness of one-half the desired wavelength, with alternate ones of said plurality of layers having a crystallographic orientation perpendicular to the plane of the layer that is 180° reversed and an interlayer of nonpiezoelectric material having a thickness of substantially less than one-half wavelength between each adjacent pair of the layers of piezoelectric material.

CROSS REFERENCE

This application is related in subject matter to Klemens application Ser. No. 505,715, filed Oct. 29, 1965 and assigned to the assignee of this invention.

BACKGROUND OF THE INVENTION

Field of the invention

This invention relates to piezoelectric transducers, particularly those for high frequency operation such as $10^8$ Hz. or greater.

Description of the prior art

It has been proposed to utilize the principle of periodic modulation of the piezoelectric parameters in a structure having acoustic continuity to improve the efficiency of the conversion process. Reference is made to copending application Ser. No. 505,715, filed Oct. 29, 1965, by Klemens and assigned to the assignee of the present invention. This application discloses a transducer having a plurality of layers, each having an effective thickness of half a desired wavelength, with a first set of alternate ones of the layers being of like oriented piezoelectric material. In one embodiment in the Klemens application the alternate layers may be passive or also of half wavelength thick piezoelectric material having opposite orientation to that of the first set.

It is disclosed in the Klemens application to employ an intermediate layer of negligible acoustic effect between layers of piezoelectric material of opposite crystallographic orientation. A thin layer of silicon oxide or aluminum oxide was found to cause the reversal of the crystallographic orientation of successive layers of piezoelectric zinc sulfide. However, such interlayers are amorphous and result in difficulty in fabricating the multilayer piezoelectric structure successfully as compared with those structures in which alternate ones of the half wavelength layers are of nonpiezoelectric material. On the other hand, structures employing half wavelength thick passive layers have a relatively low filling factor, i.e., the percentage of the applied field that is occupied by active material.

SUMMARY OF THE INVENTION

This invention has among its objects to provide an improved multilayer piezoelectric transducer that maximizes the portion of an applied electric field that is occupied by active piezoelectric elements and which is capable of being readily fabricated.

The above and additional objects and advantages are achieved by employing a structure of half wavelength thick piezoelectric layers of which adjacent ones are of reverse crystallographic orientation perpendicular to the plane of the layers and with an interlayer between the reverse oriented layers that unites them in an acoustically continuous structure with the interlayer being of nonpiezoelectric crystalline material having a thickness substantially less than one-half the desired wavelength so as to have negligible acoustic effect.

The interlayer in accordance with this invention may be suitably of a member of the group consisting of compounds of elements of Groups IV and VI of the periodic table, compounds of elements of Groups II and VI of the periodic table, and elements of Group IV of the periodic table.' Among the presently preferred materials for the interlayer are sulfides having cubic crystallographic orientation such as lead sulfide. The active piezoelectric layers may be of known materials such as II–VI compounds including cadmium sulfide and zinc sulfide which upon vapor deposition on a suitable interlayer are found to result in alternately reversed crystallographic orientation. Deposition of the layers may be performed using known methods such as those disclosed in copending application Ser. No. 505,714, filed Oct. 29, 1965, by de Klerk and assigned to the assignee of the present invention.

DESCRIPTION OF THE PREFERRED EMBODIMENTS

For background information with respect to the physical principles used in transducers to which this invention may be applied, as well as embodiments of multilayer transducers on which the present invention improves, reference should be made to the above referred to copending application of Klemens.

Figure 1:
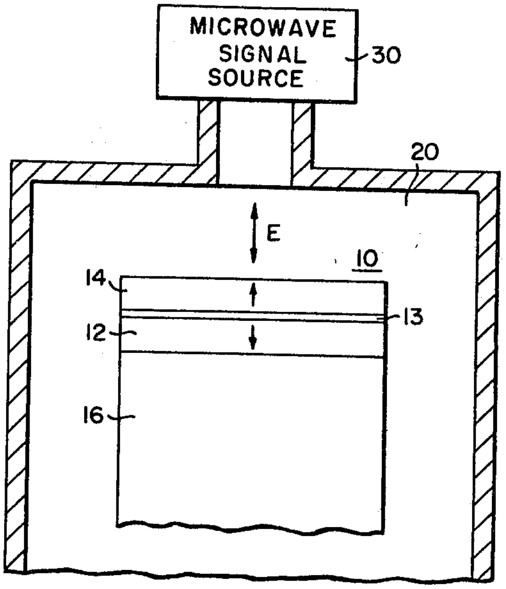
FIGURES 1 and 2 are sectional views of embodiments in accordance with the present invention.

FIGURE 1 illustrates the essential elements of one embodiment of this invention. Reference numeral 10 represents the active element of the transducer comprising a plurality of layers 12, 13 and 14 disposed on a substrate 16 in an acoustically continuous structure, that is, there is at least sufficient crystalline continuity between the layers and substrate in a direction perpendicular to the plane of the layers, as by the uniform orientation of the *c* axis of the materials of layers 12 and 14, to permit propagation of an elastic wave.

The substrate 16 serves merely as a support and as part of acoustic transmission line. It would not be necessary to use a substrate except that for high frequency wave generation the layers of the transducer are too thin to be handled and self-supported in a practical manner.

The layers 12 and 14 are both of a piezoelectric material but with one having its crystallographic axis, and therefore the phase of the generated wave, 180° reversed from that of the other of the layers. Layers 12 and 14 each have an effective thickness of one-half of the desired elastic wavelength. By effective thicknesses is meant the layer thickness may not only be one-half of the wavelength but may also be an odd integral multiple thereof. However, a small number, preferably only one half-wavelength, is preferred because if more than one half-wavelength thickness is used the conversion efficiency will be reduced.

Each half-wavelength layer need not be of the same effective thickness because different thickness layers may be used to tune to different frequencies in the same structure. For example, in order to increase bandwidth in a tuned amplifier it would be desirable to stagger tune a multilayer structure.

The active transducer structure 10 is disposed within a resonant cavity 20 that is coupled to a microwave signal source 30. An electromagnetic wave of microwave frequency is established within the cavity. In this example it is assumed that the field E is in a direction perpendicular to the plane of the plurality of layers for the generation of compressional acoustic waves. Where the frequency of the electric field E corresponds with the thickness of the layers there will be acoustic wave propagation through those layers into the substrate at that same frequency. It is also possible to generate shear acoustic waves using an electric field of suitable orientation.

The structure may utilize certain modifications as disclosed in the above referred to copending application of Klemens. For example, the layer 12 may have an additional metal layer positioned between it and the substrate 16 for the purpose of assisting in concentrating the electric field. Where size restrictions do not prohibit it, as where generation at below microwave frequencies is to be achieved, the means for establishing an electric field may include metallic electrodes disposed on opposing surfaces of the layers 12 and 14. Such a configuration will be suitable for frequencies at which resonance may be achieved without using a cavity.

Figure 2:
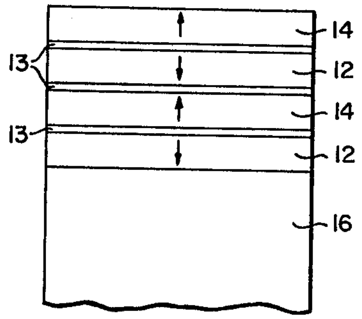

FIGURE 2 illustrates an example in which a double set of layers 12 and 14 with an interlayer 13 between each adjacent pair is employed for more efficient acoustic wave generation. The number of layers need not be limited but diminishing improvement is achieved with additional active layers. The total number of active layers 12 and 14 may be either even or odd.

The active layers 12 and 14 may be of known piezoelectric material including cadmium sulfide and zinc sulfide. Such materials are amenable to fabrication in films of adequate thickness by direct evaporation of the compound employing a substrate of a crystalline material such as aluminum oxide, titanium dioxide or of magnesium oxide. However a preferred technique is that disclosed in the above mentioned copending application of de Klerk whereby films of material having good piezoelectric properties are formed by evaporating the elements of the compound from separate sources with a controlled substrate temperature that results in stoichiometric compound formation on the substrate. Reference should be made to the copending application for further description of this technique.

The interlayer 13 is selected of nonpiezoelectric crystalline material and has a thickness substantially less than one-half of the desired wavelength to produce negligible acoustic effect. Preferred interlayer materials are members of the group consisting of compounds of elements of Groups IV and VI of the periodic table, compounds of elements of Groups II and VI of the periodic table and elements of Group IV of the periodic table. Suitable examples of IV–VI compounds include lead sulfide and tin sulfide, which are amenable to vapor deposition, as by the method of the de Klerk application, with good crystallinity in a cubic configuration having a <111> axis normal to the plane of layer. Suitable II–VI compounds include mercury sulfide. Suitable elements of Group IV include silicon, germanium, titanium or zirconium. The sulfides, selenides, and tellurides of cadmium and zinc are suitable for the interlayer if nonpiezoelectric (at least substantially so) as by being in the beta phase with cubic crystallographic orientation.

Cubic crystallographic orientation is preferred for the interlayer 13 although a hexagonal orientation layer may be employed if it is not itself piezoelectric. The interlayer should be as thin as possible consistent with providing a continuous layer of uniform crystallinity. Layers have been successfully formed in accordance with the above-mentioned application of de Klerk that have a thickness of approximately $\frac{1}{50}$ to $\frac{1}{100}$ of the wavelength generated. Generally, thicknesses of the order of 0.01 of the wavelength, or less, are suitable for the interlayer 13.

The purpose of the crystalline interlayer 13 is to permit ease in formation of the structure and to maximize the filling factor. It has been consistently found that the deposition of a piezoelectric material such as cadmium sulfide or zinc sulfide results in reversal of the crystallographic orientation from that of the previous piezoelectric layer when deposited on an interlayer. More particularly, very thin films of lead sulfide will reverse the directions of both the *c* and *a* axis of a second zinc sulfide or cadmium sulfide transducer layer with respect to that of a previous layer. This procedure can be repeated as often as required each time obtaining a reversal of the direction of the transducer crystal axis with respect to the layer below. The arrows in the drawing illustrate the direction of the *c* axis for typical piezoelectric layers.

In operation, when an electric field is applied to the transducer, one layer or set of layers, such as 12, will be compressed and the other layer or set of layers, such as 14, is expanded. Reversing the electric field will reverse the types of stress generated in the two types of layers. If an alternating electric field is applied across the structure at a given frequency such that the corresponding half wavelength is the effective thickness of each of the active layers, the structure will be mechanically resonated at that frequency. As each layer generates independently at the correct phase with respect to the other the acoustic power generated will be four times that generated by a single layer, when two active layers as in FIGURE 1 are used.

Significantly, transducers in accordance with this invention have a better filling factor than those described in the above-referred to copending application of Klemens wherein alternate half wavelength thick layers are of passive material. Thus, with the present structure the power output with a number (N) of half wavelength layers will be the same as that produced by a total of (2N—1) layers in structures requiring both active and passive elements.

Unlike silicon oxide and aluminum oxide layers mentioned for use between layers of reverse crystallographic orientation zinc sulfide in the above-referred to application of Klemens, interlayer in accordance with this invention are crystalline resulting in much lower acoustic losses as well as being susceptible to fabrication in very thin layers.

Transducers in accordance with this invention have been formed using both cadmium sulfide and zinc sulfide as the active material with as many as four active layers in each structure. The gain in power over a single layer in each case has been found to be directly proportional to the square of the number of active layers in the structure. Generation of frequencies in the range from 1 gigahertz to 10 gigahertz has been achieved.

Transducers in accordance with this invention are suited for transducer applications particularly at high frequencies such as in microwave delay lines. In such an application the substrate 16 would serve as the delay medium.

While the invention has been shown and described in a few forms only it will be apparent that various changes and modifications may be made without departing from the spirit and scope thereof.

We claim as our invention:

1. A piezoelectric transducer comprising: a plurality of layers of material joined in an acoustically continuous structure; a first of said layers being of piezoelectric material having an effective thickness of one-half of a desired wavelength and a first substantially uniform crystallographic orientation perpendicular to the plane of the layer; a second of said layers being of piezoelectric material having an effective thickness of one-half of a desired wavelength and a second substantially uniform crystallographic orientation perpendicular to the plane of the layer that is 180° reversed from that of said first layer; an interlayer between said first and second layers uniting them in an acoustically continuous structure, said interlayer being of nonpiezoelectric crystalline material and having a thickness substantially less than either of said first and second layers.

2. The subject matter of claim 1 wherein: said interlayer is of a member of the group consisting of compounds of elements of Groups IV and VI of the periodic table, compounds of elements of Groups II and VI of the periodic table, and elements of Group IV of the periodic table.

3. The subject matter of claim 2 wherein: said interlayer is of a sulfide having cubic crystallographic orientation.

4. The subject matter of claim 3 wherein said interlayer is of lead sulfide.

5. The subject matter of claim 1 wherein: said first and second layers are each of a member of the group consisting of compounds of elements of Groups II and VI of the periodic table.

6. The subject matter of claim 5 wherein: said first and second layers are each of a member of the group consisting of cadmium sulfide and zinc sulfide.

7. The subject matter of claim 1 wherein: said interlayer is of the order of 0.01 of the wavelength corresponding to the half wavelength thickness of either of said first and second layers.

8. The subject matter of claim 1 further comprising: means for establishing an alternating electric field in said plurality of layers, said field alternating at a frequency matched to that of the acoustic waves generated in said first and second layers.

9. The subject matter of claim 1 wherein: said plurality of layers includes a first group of like layers including said first layer, a second group of like layers including said second layer, and a third group of like layers including said interlayer with layers of said first and second groups alternating in sequence and a layer of said third group disposed between each adjacent pair of layers of said first and second groups.

References Cited

UNITED STATES PATENTS

| | | | |
|---|---|---|---|
| 2,787,777 | 4/1957 | Camp | 340—10 |
| 2,984,756 | 5/1961 | Bradfield | 310—8.1 |
| 3,115,588 | 12/1963 | Huether | 310—8.6 |
| 3,141,100 | 7/1964 | Hart | 310—8.6 |
| 3,271,622 | 9/1966 | Malagodi | 315—246 |
| 3,321,711 | 5/1967 | Wolfe | 330—39 |
| 3,325,743 | 6/1967 | Dlum | 337—30 |
| 3,399,314 | 8/1968 | Phillips | 310—8.6 |

J D MILLER, Primary Examiner

U.S. Cl. X.R.

310—8.2, 8.7; 321—69; 333—30